United States Patent
Kishimoto

(10) Patent No.: US 10,756,408 B2
(45) Date of Patent: Aug. 25, 2020

(54) DIRECTIONAL COUPLER, HIGH-FREQUENCY FRONT-END MODULE, AND COMMUNICATION DEVICE

(71) Applicant: Murata Manufacturing Co., Ltd., Kyoto (JP)

(72) Inventor: Ken Kishimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/977,444

(22) Filed: May 11, 2018

(65) Prior Publication Data
US 2018/0337439 A1    Nov. 22, 2018

(30) Foreign Application Priority Data

May 19, 2017    (JP) .................................. 2017-099566

(51) Int. Cl.
*H01P 5/18* (2006.01)
*H03H 7/38* (2006.01)
*H03H 7/01* (2006.01)

(52) U.S. Cl.
CPC .............. *H01P 5/185* (2013.01); *H01P 5/187* (2013.01); *H03H 7/0138* (2013.01); *H03H 7/38* (2013.01)

(58) Field of Classification Search
CPC ... H01P 5/18; H01P 5/184; H01P 5/12; H03H 7/38
USPC ........................................................ 333/109
See application file for complete search history.

(56) References Cited

U.S. PATENT DOCUMENTS

| | | | |
|---|---|---|---|
| 6,972,638 B2 | 12/2005 | Usami et al. | |
| 7,339,366 B2* | 3/2008 | Li | G01R 21/01 324/95 |
| 8,606,198 B1* | 12/2013 | Wright | H01P 5/18 333/109 |

(Continued)

FOREIGN PATENT DOCUMENTS

| CN | 104852115 A | 8/2015 |
|---|---|---|
| JP | 2004-40259 A | 2/2004 |

(Continued)

OTHER PUBLICATIONS

Japanese Notice of Reasons for Rejection for Japanese Patent Application No. 2017-099566, dated Oct. 10, 2019.

*Primary Examiner* — Dean O Takaoka
(74) *Attorney, Agent, or Firm* — Pearne & Gordon LLP

(57) ABSTRACT

A directional coupler includes first and second transmission lines, first and second coupling lines, a termination resistor, a coupling signal output terminal, and an impedance-adjusting circuit. The first coupling line is electromagnetically coupled to the first transmission line. The second coupling line is connected in series with the first coupling line and is electromagnetically coupled to the second transmission line. The termination resistor is connected to an end portion of the first coupling line that is on the opposite side from the end portion of the first coupling line that is connected to the second coupling line. The coupling signal output terminal is connected to an end portion of the second coupling line that is on the opposite side from the end portion of the second coupling line that is connected to the first coupling line. The impedance-adjusting circuit is connected between the first and second coupling lines.

18 Claims, 6 Drawing Sheets

(56) References Cited

U.S. PATENT DOCUMENTS

| | | | |
|---|---|---|---|
| 8,699,975 B1* | 4/2014 | Schleicher | H03G 3/3042 |
| | | | 333/109 |
| 8,773,216 B2* | 7/2014 | Dupont | H01P 5/184 |
| | | | 333/109 |
| 8,798,561 B2* | 8/2014 | Acimovic | H03F 1/0294 |
| | | | 330/295 |
| 9,385,411 B2* | 7/2016 | Ohashi | H01P 5/187 |
| 9,893,408 B2* | 2/2018 | Ashida | H01P 5/18 |
| 10,027,292 B1* | 7/2018 | Fujii | H03F 1/301 |
| 2015/0236666 A1* | 8/2015 | Ootsuka | H01P 5/185 |
| | | | 333/109 |
| 2016/0218410 A1* | 7/2016 | Ootsuka | H01P 5/187 |

FOREIGN PATENT DOCUMENTS

| | | |
|---|---|---|
| JP | 2015-154373 A | 8/2015 |
| JP | 2017-28621 A | 2/2017 |

* cited by examiner

○ : CONFIGURATION OF PRESENT APPLICATION
△ : COMPARATIVE CONFIGURATION

● : CONFIGURATION OF PRESENT APPLICATION
▲ : COMPARATIVE CONFIGURATION

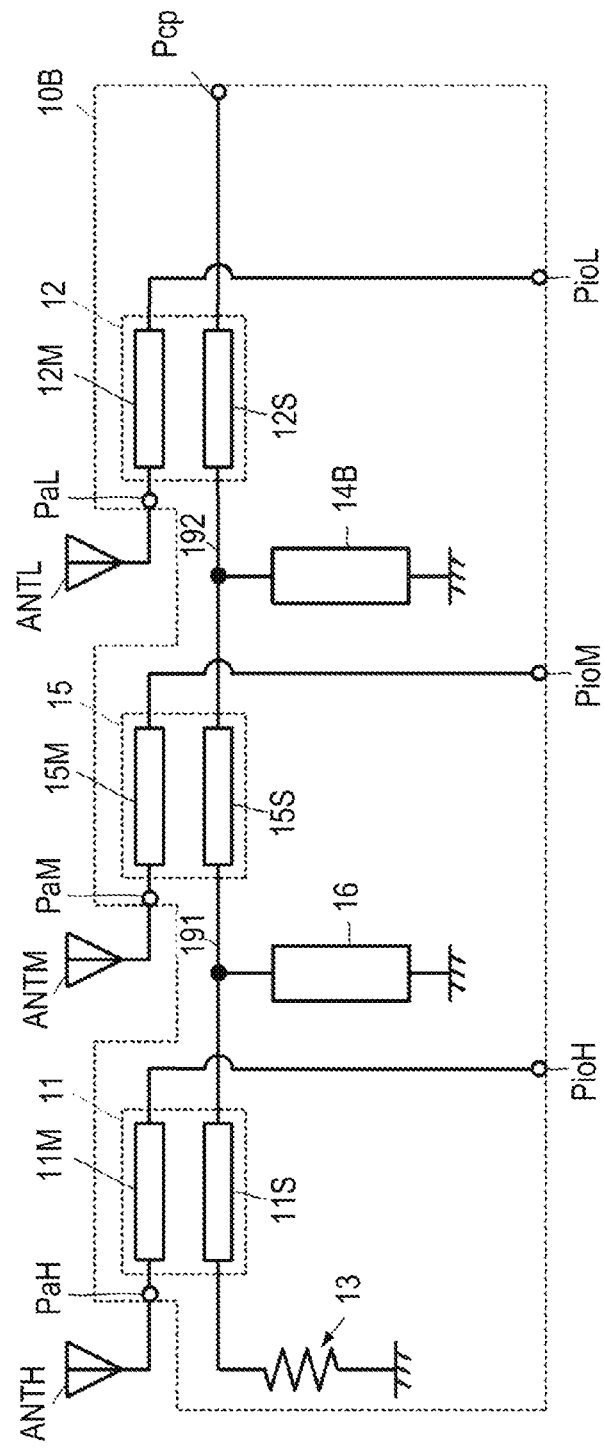

DIRECTIONAL COUPLER, HIGH-FREQUENCY FRONT-END MODULE, AND COMMUNICATION DEVICE

This application claims priority from Japanese Patent Application No. 2017-099566 filed on May 19, 2017. The content of this application is incorporated herein by reference in its entirety.

BACKGROUND

The present disclosure relates to a directional coupler that performs electromagnetic coupling for a plurality of high-frequency signals having different frequencies, relates to a high-frequency front-end module that includes the directional coupler, and relates to a communication device.

Japanese Unexamined Patent Application Publication No. 2004-40259 discloses a directional coupler that supports a plurality of high-frequency signals. The directional coupler disclosed in Japanese Unexamined Patent Application Publication No. 2004-40259 includes a first transmission line, a second transmission line, and a coupling line. The first transmission line transmits a high-frequency signal of a first frequency. The second transmission line transmits a high-frequency signal of a second frequency. The coupling line is coupled to the first transmission line and the second transmission line.

Regarded as an electrical circuit, each of the first transmission line and the second transmission line are coupled to the same part of the coupling line.

However, in the configuration disclosed in Japanese Unexamined Patent Application Publication No. 2004-40259, the first transmission line and the second transmission line are arranged close to each other, and therefore the first transmission line and the second transmission line may become coupled with each other. Consequently, when the impedance of one of the transmission lines changes, the impedance of the other transmission line also changes and this is connected to degradation of the coupling performance.

In addition, in the configuration disclosed in Japanese Unexamined Patent Application Publication No. 2004-40259, since each of the first transmission line and the second transmission line are coupled to the same part of the coupling line, it is not easy to optimize the coupling path length for the high-frequency signals transmitted through the respective transmission lines.

BRIEF SUMMARY

Accordingly, the present disclosure provides a directional coupler that has stable and high coupling performance for a plurality of high-frequency signals having different frequencies, to provide a high-frequency front-end module that includes the directional coupler, and to provide a communication device.

A directional coupler according to an embodiment of the present disclosure includes: a first transmission line; a second transmission line; a first coupling line; a second coupling line; a termination resistor; a coupling signal output terminal; and an impedance-adjusting circuit. The first transmission line transmits a first high-frequency signal of a first frequency. The second transmission line transmits a second high-frequency signal of a second frequency that is different from the first frequency. The first coupling line is electromagnetically coupled to the first transmission line. The second coupling line is connected in series with the first coupling line and is electromagnetically coupled to the second transmission line. The impedance-adjusting circuit performs impedance matching for the first frequency and the second frequency with respect to a series line consisting of the first coupling line and the second coupling line.

In this configuration, the impedances of the first coupling line and the second coupling line are matched by the impedance-adjusting circuit in a configuration where the first coupling line and the second coupling line are independent of each other.

A directional coupler according to an embodiment of the present disclosure includes: a first transmission line; a second transmission line; a first coupling line; a second coupling line; a termination resistor; a coupling signal output terminal; and an impedance-adjusting circuit. The first transmission line transmits a first high-frequency signal of a first frequency. The second transmission line transmits a second high-frequency signal of a second frequency that is different from the first frequency. The first coupling line is electromagnetically coupled to the first transmission line. The second coupling line is connected in series with the first coupling line and is electromagnetically coupled to the second transmission line. The termination resistor is connected to an end portion of the first coupling line that is on the opposite side from the end portion of the first coupling line that is connected to the second coupling line. The coupling signal output terminal is connected to an end portion of the second coupling line that is on the opposite side from the end portion of the second coupling line that is connected to the first coupling line. The impedance-adjusting circuit is connected between the first coupling line and the second coupling line.

In this configuration, the first coupling line and the second coupling line are independent of each other. In addition, the impedance on the termination-side of the second coupling line is matched by the impedance-adjusting circuit.

Furthermore, in the directional coupler according to the embodiment of the present disclosure, the impedance-adjusting circuit can include an inductor, a capacitor, and a resistor that are connected between an intermediate transmission line, which connects the first coupling line and the second coupling line to each other, and a ground potential.

In this configuration, impedance matching on the termination side of the second coupling line and suppression of transmission loss from the first coupling line to the coupling signal output terminal are realized with high precision.

In addition, in the directional coupler according to the embodiment of the present disclosure, the first frequency can be higher than the second frequency.

In this configuration, it is easy to realize impedance matching on the termination side of the second coupling line.

In addition, the directional coupler according to the embodiment of the present disclosure can have the following configuration. The directional coupler includes a multilayer substrate in which a plurality of dielectric layers are stacked on top of one another and at which the first transmission line, the second transmission line, the first coupling line, and the second coupling line are formed. The multilayer substrate includes a first dielectric layer on which the first transmission line and the second transmission line are formed, and a second dielectric layer on which the first coupling line and the second coupling line are formed. The first transmission line and the second transmission line are arranged at different positions in a plan view of the multilayer substrate. The first coupling line overlaps the first transmission line in plan view. The second coupling line overlaps the second transmission line in plan view.

In this configuration, the first transmission line and the first coupling line are electromagnetically coupled with certainty, and the second transmission line and the second coupling line are electromagnetically coupled with certainty.

In addition, in the directional coupler according to the embodiment of the present disclosure, at least one electronic component, which is included in the impedance-adjusting circuit, can be a surface mount electronic component that is mounted on a surface of the multilayer substrate.

With this configuration, the impedance of the impedance-adjusting circuit is easily adjusted.

In addition, the directional coupler according to the embodiment of the present disclosure can have the following configuration. The termination resistor is a surface mount electronic component that is mounted on a surface of the multilayer substrate. The first coupling line contacts the rear surface of a dielectric layer that forms a surface layer of the multilayer substrate, and is connected to the termination resistor by only a via conductor formed in the multilayer substrate.

In this configuration, the impedance on the termination side of the first coupling line is precisely matched in a directional coupler realized using a multilayer substrate.

In addition, the directional coupler according to the embodiment of the present disclosure can include a ground via conductor that is connected to a ground terminal on a rear surface of the multilayer substrate and is disposed between the first coupling line and the second coupling line and between the first transmission line and the second transmission line.

In this configuration, both of unwanted electromagnetic coupling between the first transmission line and the second transmission line, and unwanted electromagnetic coupling between the first coupling line and the second coupling line are suppressed.

In addition, a high-frequency front-end module of an embodiment of the present disclosure includes: any one of the above-described directional couplers; a first filter that is connected to the first transmission line; and a second filter that is connected to the second transmission line.

With this configuration, a high-frequency front-end module is realized that has excellent coupling performance.

In addition, the high-frequency front-end module according to the embodiment of the present disclosure may include a high-frequency amplification circuit that is connected to at least one of the first filter and the second filter.

With this configuration, the high-frequency amplification circuit can be controlled on the basis of a coupling signal.

In addition, a communication device according to an embodiment of the present disclosure includes: the above-described high-frequency front-end module; a first antenna that is connected to the first transmission line; a second antenna that is connected to the second transmission line; and a control IC that controls the high-frequency amplification circuit using a coupling signal output from the coupling signal output terminal.

With this configuration, a high-frequency amplification circuit is controlled, appropriately reflecting a communication state of the first high-frequency signal or the second high-frequency signal.

According to embodiments of the present disclosure, stable and high coupling performance is realized for a plurality of high-frequency signals having different frequencies from each other.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 7 is a circuit diagram illustrating another form of a directional coupler according to an embodiment of the present disclosure.

DETAILED DESCRIPTION

Figure 1:
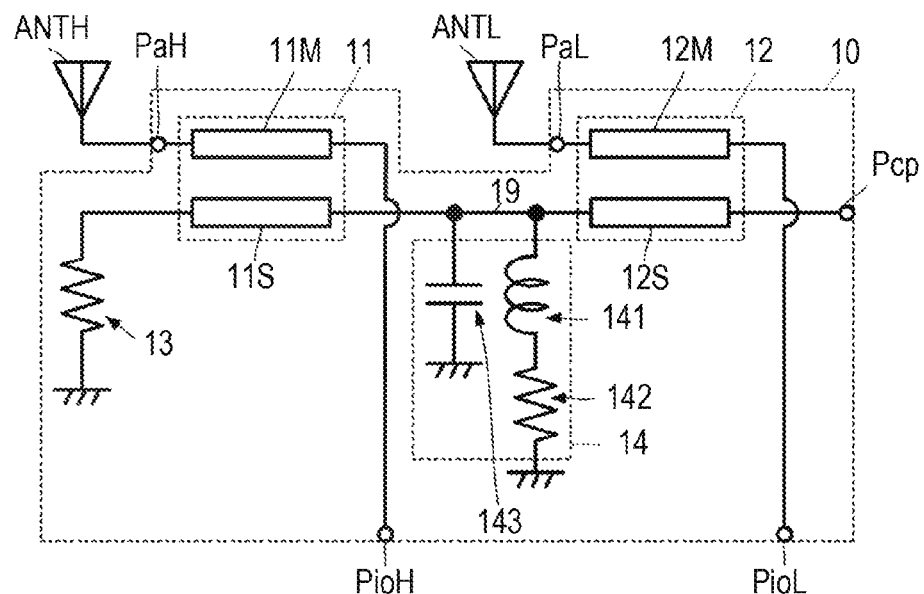
FIG. 1 is a circuit diagram of a directional coupler according to an embodiment of the present disclosure.

A directional coupler, a high-frequency front-end module, and a communication device according to embodiments of the present disclosure will be described while referring to the drawings. FIG. 1 is a circuit diagram of a directional coupler according to an embodiment of the present disclosure.

A directional coupler 10 has the following configuration, and as a result operates as a directional coupler for high-frequency signals having a plurality of frequencies, namely, a high-frequency signal of a first frequency and a high-frequency signal of a second frequency. The frequency of the first high-frequency signal is higher than the frequency of the second high-frequency signal. For example, the frequency of the first high-frequency signal is a 5 GHz band and the frequency of the second high-frequency signal is a 2 GHz band.

The directional coupler 10 includes a coupling circuit 11, a coupling circuit 12, a termination resistor 13, and an impedance-adjusting circuit 14. In addition, the directional coupler 10 includes an antenna terminal PaH, an antenna terminal PaL, an input/output terminal PioH, an input/output terminal PioL, and a coupling signal output terminal Pcp.

The coupling circuit 11 includes a transmission line 11M and a coupling line 11S. The transmission line 11M and the coupling line 11S are electromagnetically coupled to each other. The coupling circuit 11 is configured to operate as a directional coupler at the first frequency. The transmission line 11M corresponds to a "first transmission line" of the present disclosure and the coupling line 11S corresponds to a "first coupling line" of the present disclosure.

The coupling circuit 12 includes a transmission line 12M and a coupling line 12S. The transmission line 12M and the coupling line 12S are electromagnetically coupled to each other. The coupling circuit 12 is configured to operate as a directional coupler at the second frequency. The transmission line 12M corresponds to a "second transmission line" of the present disclosure and the coupling line 12S corresponds to a "second coupling line" of the present disclosure.

The transmission line 11M is connected between the input/output terminal PioH and the antenna terminal PaH. The antenna terminal PaH is connected to an external antenna ANTH.

The transmission line 12M is connected between the input/output terminal PioL and the antenna terminal PaL. The antenna terminal PaL is connected to an external antenna ANTL.

One end of the coupling line 11S is grounded via the termination resistor 13. The termination resistor 13 is a 50Ω resistor, for example. In other words, the one end of the coupling line 11S is connected to a ground potential via the termination resistor 13.

The other end of the coupling line 11S is connected to one end of the coupling line 12S via an intermediate transmission line 19. Although the intermediate transmission line 19 is depicted as being long in FIG. 1, the intermediate transmission line 19 can be short compared to the wavelength of the second high-frequency signal. The other end of the coupling line 12S is connected to the coupling signal output terminal Pcp. In other words, the termination resister 13, the coupling line 11S, the coupling line 12S, and the coupling signal output terminal Pcp are connected in series.

The impedance-adjusting circuit 14 includes an inductor 141, a resistance element 142, and a capacitor 143. A series circuit consisting of the inductor 141 and the resistance element 142 is connected between the intermediate transmission line 19 and the ground potential. The capacitor 143 is connected between the intermediate transmission line 19 and the ground potential. In other words, the parallel circuit composed of both the capacitor 143 and the series circuit consisting of the inductor 141 and the resistance element 142 is connected between the intermediate transmission line 19 and the ground potential.

When the first high-frequency signal and the second high-frequency signal, which have different frequencies from each other, are transmitted through the thus-configured directional coupler 10, the directional coupler 10 generates coupling signals that respectively correspond to these high-frequency signals and outputs the generated coupling signals from the coupling signal output terminal Pcp.

Transmission of First High-Frequency Signal

The first high-frequency signal is input from the input/output terminal PioH, is transmitted along the transmission line 11M, is output from the antenna terminal PaH, and is transmitted from the antenna ANTH.

When the first high-frequency signal is input from the input/output terminal PioH and transmitted along the transmission line 11M, a first transmission coupling signal having the same first frequency as the first high-frequency signal is transmitted along the coupling line 11S due to electromagnetic coupling. The first transmission coupling signal is output from the coupling signal output terminal Pcp. The power strength of the first transmission coupling signal depends on the power strength of the first high-frequency signal.

Reception of First High-Frequency Signal

On the other hand, a first high-frequency signal received by the antenna ANTH is input from the antenna terminal PaH, is transmitted along the transmission line 11M, and is output from the input/output terminal PioH.

When the first high-frequency signal is input from the antenna terminal PaH and transmitted along the transmission line 11M, a first reception coupling signal is transmitted along the coupling line 11S due to electromagnetic coupling. The first reception coupling signal is guided to the termination resistor 13 and attenuated. Thus, the first reception coupling signal is not output from the coupling signal output terminal Pcp.

In this case, the termination resistor 13 is directly connected to the coupling line 11S. Therefore, the impedance seen from the coupling line 11S in a direction toward the termination resistor 13 is matched with respect to the first reception coupling signal (first high-frequency signal). Therefore, the first reception coupling signal is not reflected at the termination resistor 13 and is definitely not output from the coupling signal output terminal Pcp.

Transmission of Second High-Frequency Signal

The second high-frequency signal is input from the input/output terminal PioL, is transmitted along the transmission line 12M, is output from the antenna terminal PaL, and is transmitted from the antenna ANTL.

When the second high-frequency signal is input from the input/output terminal PioL and transmitted along the transmission line 12M, a second transmission coupling signal having the same second frequency as the second high-frequency signal is transmitted along the coupling line 12S due to electromagnetic coupling. The second transmission coupling signal is output from the coupling signal output terminal Pcp. The power strength of the second transmission coupling signal depends on the power strength of the second high-frequency signal.

Reception of Second High-Frequency Signal

On the other hand, a second high-frequency signal received by the antenna ANTL is input from the antenna terminal PaL, is transmitted along the transmission line 12M, and is output from the input/output terminal PioL.

When the second high-frequency signal is input from the antenna terminal PaL and transmitted along the transmission line 12M, a second reception coupling signal is transmitted along the coupling line 12S due to electromagnetic coupling.

In this case, the coupling line 11S is connected between the coupling line 12S and the termination resistor 13. Therefore, with just this circuit configuration, the impedance seen from the coupling line 12S in a direction toward the termination resistor 13 is not matched with respect to the second reception coupling signal (second high-frequency signal).

Therefore, in the directional coupler 10, the impedance seen from the coupling line 12S toward the termination resistor 13 is matched by connecting the impedance-adjusting circuit 14 to the coupling line 11S side of the coupling line 12S. The impedance of the impedance-adjusting circuit 14 is set using the inductance of the inductor 141, the resistance of the resistance element 142, and the capacitance of the capacitor 143.

Thus, the second reception coupling signal is guided to the termination resistor 13 and attenuated. Therefore, the second reception coupling signal is not output from the coupling signal output terminal Pcp.

Figures 2A, 2B:
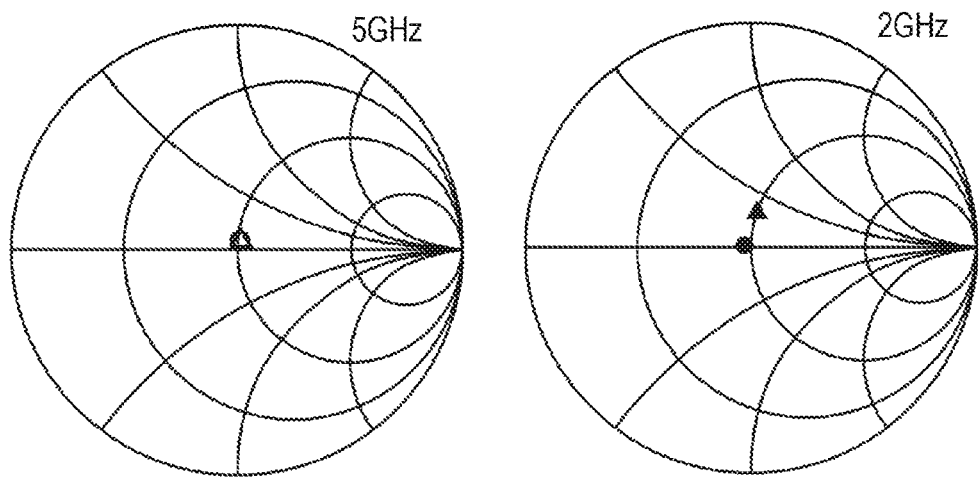
FIG. 2A is a Smith chart for a first high-frequency signal of the directional coupler according to the embodiment of the present disclosure.
FIG. 2B is a Smith chart for a second high-frequency signal of the directional coupler according to the embodiment of the present disclosure.

FIG. 2A is a Smith chart for the first high-frequency signal in the directional coupler according to the embodiment of the present disclosure. In FIG. 2A, ○ represents the impedance for the configuration of the present application and Δ represents the impedance for a comparative configuration. FIG. 2B is a Smith chart for the second high-frequency signal in the directional coupler according to the embodiment of the present disclosure. In FIG. 2B, ● represents the impedance for the configuration of the present application and ▲ represents the impedance for the comparative configuration. The comparative configuration is obtained by removing the impedance-adjusting circuit 14 from the directional coupler 10.

As illustrated in FIG. 2A, impedance matching is realized for the first high-frequency signal in a similar manner with the configuration of the present application and with the comparative configuration. On the other hand, as illustrated in FIG. 2B, impedance matching is not realized for the second high-frequency signal with the comparative configuration, whereas impedance matching is realized for the second high-frequency signal with the configuration of the present application.

Figure 3A:
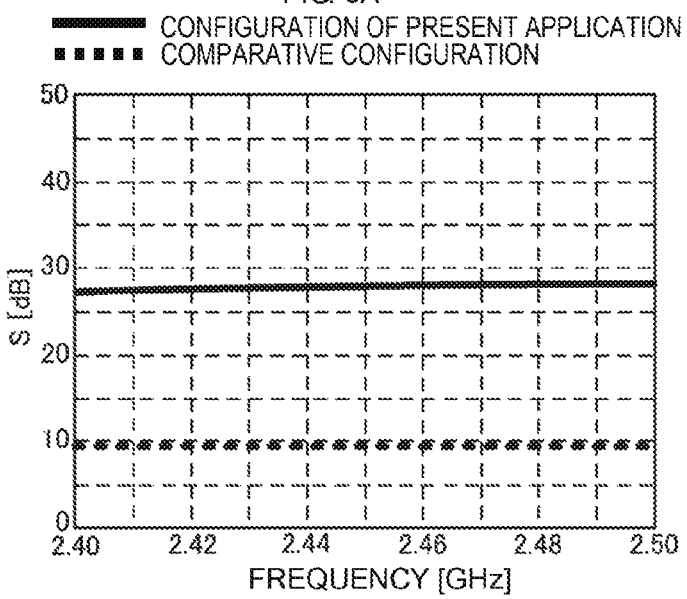
FIG. 3A is a graph illustrating the directivity of the directional coupler with respect to the second high-frequency signal.
Figure 3B:
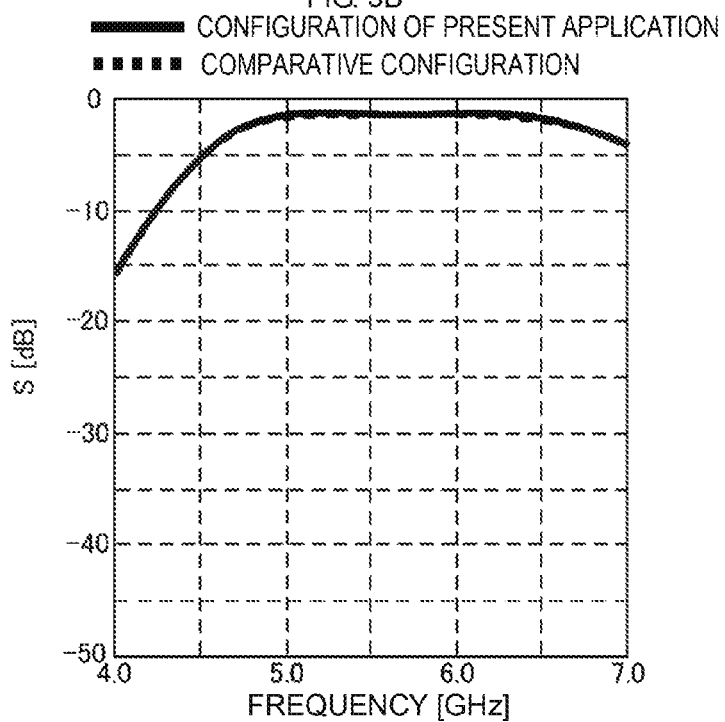
FIG. 3B is a graph illustrating insertion loss with respect to the first high-frequency signal.

Even when the impedance-adjusting circuit 14 is included, there is no degradation in transmission characteristics for the case where the first high-frequency signal and the second high-frequency signal are output to the coupling signal output terminal Pcp, as illustrated in FIGS. 3A and 3B. FIG. 3A is a graph illustrating the directivity of the directional coupler with respect to the second high-frequency signal, and FIG. 3B is a graph illustrating insertion loss with respect to the first high-frequency signal. FIG. 3B illustrates insertion loss in a state where a band pass filter, the passband of which is the frequency band of the first high-frequency signal, is connected to the coupling signal output terminal of the directional coupler.

Due to the configuration of this embodiment, degradation of insertion loss with respect to the first high-frequency signal can be suppressed as illustrated in FIG. 3B while improving directivity with respect to the second high-frequency signal as illustrated in FIG. 3A.

Thus, the directional coupler 10 can realize stable and high coupling performance for a plurality of high-frequency signals having different frequencies from each other. In addition, in the directional coupler 10, the coupling line 11S for the first high-frequency signal and the coupling line 12S for the second high-frequency signal formed so as to be independent of each other. Thus, setting of the line length of the coupling line 11S in accordance with the first high-frequency signal and setting of the line length of the coupling line 12S in accordance with the second high-frequency signal can be performed independently of each other. Therefore, the degree of coupling with respect to the first high-frequency signal and the degree of coupling with respect to the second high-frequency signal can be appropriately adjusted, and the coupling performance can be further improved.

Figure 4:
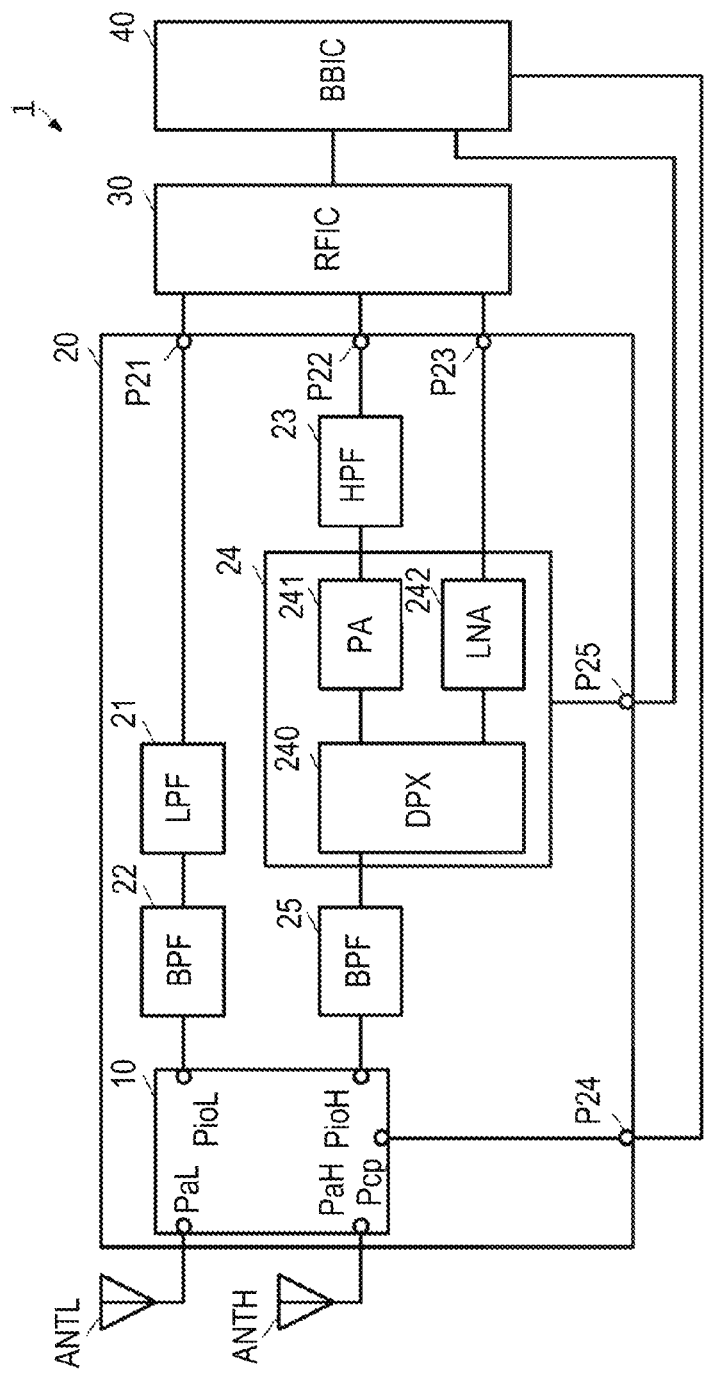
FIG. 4 is a circuit diagram of a communication device according to an embodiment of the present disclosure.

The thus-configured directional coupler 10 can be applied to a high-frequency front-end module and a communication device as will be described next. FIG. 4 is a circuit diagram of a communication device according to an embodiment of the present disclosure.

As illustrated in FIG. 4, a communication device 1 includes: a high-frequency front-end module 20, which includes the directional coupler 10; an RFIC 30; a baseband IC (BBIC) 40; the antenna ANTH; and the antenna ANTL.

Figure 5:
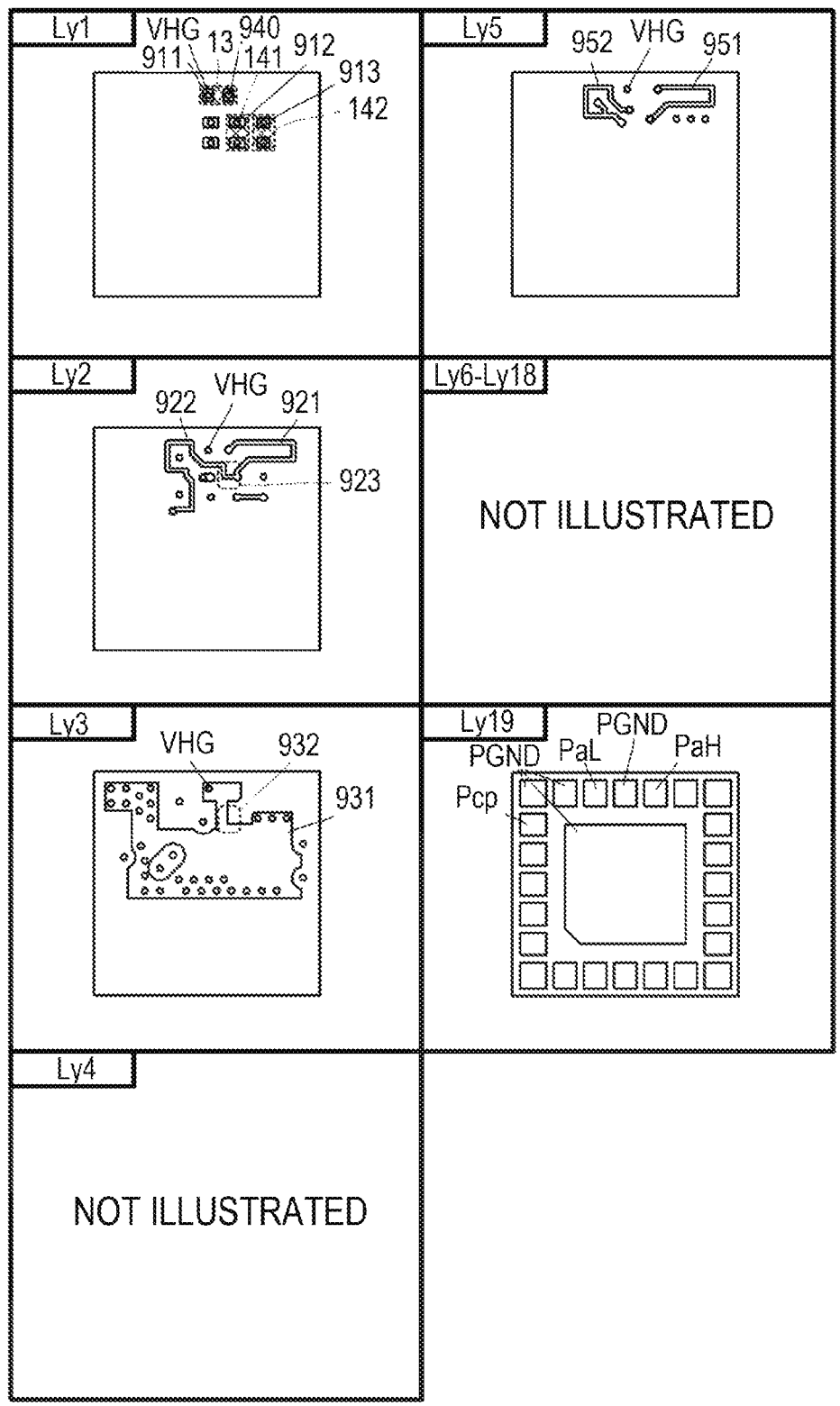
FIG. 5 is a layer diagram of a multilayer substrate module in which the communication device according to the embodiment of the present disclosure is implemented.

The high-frequency front-end module 20 includes the directional coupler 10, a low pass filter (LPF) 21, a band pass filter (BPF) 22, a high pass filter (HPF) 23, a composite module 24, and a band pass filter (BPF) 25. The composite module 24 includes a demultiplexer (DPX) 240, a power amplifier (PA) 241, and a low-noise amplifier (LNA) 242. The high-frequency front-end module 20 has terminals P21, P22, P23, P24, and P25. In FIG. 5, the demultiplexer (DPX) 240 is a duplexer.

The antenna terminal PaL of the directional coupler 10 is connected to the antenna ANTL and the antenna terminal PaH of the directional coupler 10 is connected to the antenna ANTH. The coupling signal output terminal Pcp is connected to the terminal P24.

The input/output terminal PioL is connected to the BPF 22 and the BPF 22 is connected to the LPF 21. The LPF 21 is connected to the terminal P21.

The input/output terminal PioH is connected to the BPF 25 and the BPF 25 is connected to the DPX 240 of the composite module 24. The DPX 240 is connected to each of the PA 241 and the LNA 242. The PA 241 is connected to the HPF 23 and the HPF 23 is connected to the terminal P22. The LNA 242 is connected to the terminal P23. In addition, the composite module 24 is connected to the terminal P25.

The terminals P21, P22, and P23 of the high-frequency front-end module 20 are connected to the RFIC 30, and the RFIC 30 is connected to the BBIC 40. The terminals P24 and P25 of the high-frequency front-end module 20 are connected to the BBIC 40.

The BBIC 40 generates control signals at a baseband frequency and outputs the control signals to the RFIC 30 and the composite module 24. The control signal output to the RFIC 30 is related to transmission/reception control of high-frequency signals. The control signal output to the composite module 24 is related to the amplification factor of the PA 241. The DPX 240 may be a switch, and control signals output to the composite module 24 may include a switch control signal if the DPX 240 is a switch.

The RFIC 30 performs transmission/reception control for high-frequency signals.

The LPF 21 and the BPF 22 remove unwanted waves from the second high-frequency signal. The HPF 23 and the BPF 25 remove unwanted waves from the first high-frequency signal. The PA 241 and the LNA 242 amplify the first high-frequency signal.

When First High-Frequency Signal is Transmitted

When a transmission signal for the first high-frequency signal is output from the BBIC 40, the RFIC 30 generates the first high-frequency signal and outputs the generated first high-frequency signal to the terminal P22. The HPF 23 removes unwanted waves from the first high-frequency signal input from the terminal P22. The PA 241 amplifies the first high-frequency signal and outputs the amplified first high-frequency signal to the DPX 240. The BPF 25 removes unwanted waves from the first high-frequency signal output from the DPX 240, and the resulting first high-frequency signal is output to the input/output terminal PioH of the directional coupler 10. The directional coupler 10 outputs the first high-frequency signal from the antenna terminal PaH, and the antenna ANTH transmits the first high-frequency signal.

At this time, the directional coupler 10 outputs a coupling signal corresponding to the first high-frequency signal from the coupling signal output terminal Pcp. The BBIC 40 generates a control signal for controlling the amplification factor of the PA 241 on the basis of this coupling signal and outputs the generated control signal to the composite module 24. The PA 241 determines the amplification factor of the first high-frequency signal in accordance with this control signal.

When First High-Frequency Signal is Received

The antenna ANTH outputs a received first high-frequency signal to the antenna terminal PaH of the directional coupler 10. The directional coupler 10 outputs the first high-frequency signal from the input/output terminal PioH to the BPF 25. The BPF 25 removes unwanted waves from the first high-frequency signal and outputs the resulting first high-frequency signal to the DPX 240. The DPX 240 outputs the first high-frequency signal to the LNA 242. The LNA 242 amplifies the first high-frequency signal and outputs the amplified first high-frequency signal to the terminal P23. The RFIC 30 demodulates the first high-frequency signal input from the terminal P23.

When Second High-Frequency Signal is Transmitted

When a transmission signal for the second high-frequency signal is output from the BBIC 40, the RFIC 30 generates the second high-frequency signal and outputs the generated second high-frequency signal to the terminal P21. The LPF 21 and the BPF 22 remove unwanted waves from the second high-frequency signal input from the terminal P21. The directional coupler 10 outputs the second high-frequency signal input from the input/output terminal PioL to the antenna terminal PaL, and the antenna ANTL transmits the second high-frequency signal.

When Second High-Frequency Signal is Received

The antenna ANTL outputs a received second high-frequency signal to the antenna terminal PaL of the directional coupler 10. The directional coupler 10 outputs the second high-frequency signal from the input/output terminal PioL to the BPF 22. The BPF 22 and the LPF 21 remove unwanted waves from the second high-frequency signal and output the resulting second high-frequency signal to the terminal P21. The RFIC 30 demodulates the second high-frequency signal input from the terminal P21.

Thus, the communication device 1 can transmit a first high-frequency signal for which the amplification factor has been appropriately adjusted in accordance with the environment and so forth. Thus, communication characteristics of the communication device 1 are improved.

Next, the structures of the directional coupler 10 and the high-frequency front-end module 20 having the above-described circuit configurations will be described using FIG. 5. FIG. 5 is a layer diagram of a multilayer substrate module in which the communication device according to the embodiment of the present disclosure is implemented. In FIG. 5, illustration of a fourth dielectric layer Ly4 and sixth to eighteen dielectric layers Ly6 to Ly18 of a multilayer substrate is omitted. In addition, in FIG. 5, illustration of parts of conductor patterns on the first to third dielectric layers Ly1 to Ly3 and the fifth dielectric layer Ly5 is omitted.

The high-frequency front-end module 20 is formed of a multilayer substrate and surface mount devices that are mounted on the multilayer substrate. The multilayer substrate is formed by stacking a plurality of dielectric layers, on which conductor patterns are formed, on top of one another. The multilayer substrate is formed of nineteen dielectric layers Ly1 to Ly19. The dielectric layers Ly1 to Ly19 are stacked in this order from the front surface side of the multilayer substrate. The number of dielectric layers that form the multilayer substrate is not limited to this example.

A plurality of land conductors including land conductors 911, 912, 913, and 940 are formed on the dielectric layer Ly1, which forms the surface layer of the multilayer substrate. The surface mount devices are mounted on this plurality of land conductors. The termination resistor 13, which is composed of a surface mount device, is mounted on the land conductors 911 and 940. The inductor 141, which is composed of a surface mount device, is mounted on the land conductor 912. The resistance element 142, which is composed of a surface mount device, is mounted on the land conductor 913. Although not illustrated, the above-described composite module 24 is also mounted on a corresponding land conductor.

Line-shaped conductor patterns 921 and 922 are formed on the dielectric layer Ly2. The conductor pattern 921 corresponds to the coupling line 11S and the conductor pattern 922 corresponds to the coupling line 12S. The conductor pattern 921 and the conductor pattern 922 are formed at different positions on a surface of the dielectric layer Ly2 (different positions in plan view (viewed in a direction perpendicular to the surface of the dielectric layer Ly2) of multilayer substrate).

The conductor pattern 921 and the conductor pattern 922 are connected to each other by a conductor pattern 923. The conductor pattern 923 corresponds to the intermediate transmission line 19.

One end portion of the conductor pattern 921 (coupling line 11S) in the direction in which conductor pattern 921 extends (end portion on opposite side from side connected to conductor pattern 923) is connected to one end portion of the termination resistor 13 via a via conductor.

One end portion of the conductor pattern 922 (coupling line 12S) in the direction in which the conductor pattern 922 extends (end portion on opposite side from side connected to conductor pattern 923) is connected to the coupling signal output terminal Pcp on the rear surface of the multilayer substrate via a via conductor.

The conductor pattern 923 (intermediate transmission line 19) is connected to the inductor 141 via a via conductor. The inductor 141 and the resistance element 142 are connected to each other by a conductor pattern that is formed on the dielectric layer Ly2. The resistance element 142 is connected to a ground terminal PGND that is on the rear surface of the multilayer substrate via a via conductor.

A ground conductor 931 is formed on the dielectric layer Ly3. The ground conductor 931 does not overlap the conductor patterns 921 and 922 in a plan view of the multilayer substrate. In addition, the ground conductor 931 overlaps the conductor pattern 923 (intermediate transmission line 19), which connects the conductor pattern 921 and the conductor pattern 922 to each other. The capacitor 143 is formed by a structure in which the ground conductor 931 and the conductor pattern 923 (intermediate transmission line 19) face each other with the dielectric layer Ly2 interposed therebetween. The impedance-adjusting circuit 14 of the directional coupler 10 is realized by the inductor 141, the resistance element 142, and the capacitor 143.

Line-shaped conductor patterns 951 and 952 are formed on the dielectric layer Ly5. The conductor pattern 951 corresponds to the transmission line 11M and the conductor pattern 952 corresponds to the transmission line 12M. The conductor pattern 951 and the conductor pattern 952 are formed at different positions on a surface of the dielectric layer Ly5 (different positions in plan view of multilayer substrate).

The conductor pattern 951 (transmission line 11M) and the conductor pattern 921 (coupling line 11S) overlap each other in a plan view of the multilayer substrate. In other words, the conductor pattern 921 is formed at a position on the dielectric layer Ly2 that overlaps the conductor pattern 951, when the dielectric layer Ly2 and the dielectric layer Ly5 are stacked on top of each other directly or with at least one dielectric layer Ly3 or ly4 therebetween. Thus, the conductor pattern 951 (transmission line 11M) and the conductor pattern 921 (coupling line 11S) are electromagnetically coupled to each other and function as a directional coupler with respect to the first high-frequency signal.

The conductor pattern 952 (transmission line 12M) and the conductor pattern 922 (coupling line 12S) overlap each other in a plan view of the multilayer substrate. In other words, the conductor pattern 922 is formed at a position on the dielectric layer Ly2 that overlaps the conductor pattern 952, when the dielectric layer Ly2 and the dielectric layer Ly5 are stacked on top of each other directly or with at least one dielectric layer Ly3 or ly4 therebetween. Thus, the conductor pattern 952 (transmission line 12M) and the conductor pattern 922 (coupling line 12S) are electromagnetically coupled to each other and function as a directional coupler with respect to the second high-frequency signal.

Thus, the directional coupler 10 and the high-frequency front-end module 20 can be realized using a multilayer substrate.

In addition, in the configuration of this embodiment, the inductor 141 and the resistance element 142, which form part of the impedance-adjusting circuit 14, are surface mount electronic components that are mounted on the surface of the multilayer substrate. Thus, the impedance of the impedance-adjusting circuit 14 can be adjusted by exchanging inductor 141 and resistance element 142 for other inductors and resistance elements having different device values. Therefore, the impedance of the impedance-adjusting circuit 14 is easily adjusted.

In addition, in the configuration of this embodiment, the termination resistor 13 is a surface mount electronic component that is mounted on the surface of the multilayer substrate. The coupling line 11S contacts the rear surface of the dielectric layer Ly1, which forms the surface layer of the multilayer substrate, and is connected to the termination resistor 13 by only a via conductor formed in the multilayer substrate.

Thus, the coupling line 11S and the termination resistor 13 are very close to each other and the termination-side impedance of the coupling line 11S is precisely matched.

In addition, in the configuration of this embodiment, as illustrated in FIG. 5, a ground via conductor VHG, which is connected to the ground terminal PGND on the rear surface of the multilayer substrate, is formed between the coupling line 11S for the first high-frequency signal and the coupling line 12S for the second high-frequency signal and between the transmission line 11M for the first high-frequency signal and the transmission line 12M for the second high-frequency signal.

Thus, unwanted electromagnetic coupling between the coupling line 11S for the first high-frequency signal and the coupling line 12S for the second high-frequency signal and unwanted electromagnetic coupling between the transmission line 11M for the first high-frequency signal and the transmission line 12M for the second high-frequency signal are suppressed.

Figure 6:
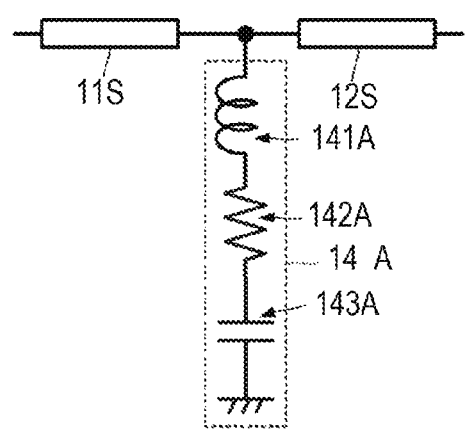
FIG. 6 is a circuit diagram illustrating another form of an impedance-adjusting circuit according to an embodiment of the present disclosure.

In the above description, a circuit is described for the impedance-adjusting circuit 14 that is composed both of a series circuit composed of inductor 141 and the resistance element 142, and the capacitor 143 that is connected in parallel with the series circuit. However, the impedance-adjusting circuit may have another configuration. FIG. 6 is a circuit diagram illustrating another form of an impedance-adjusting circuit according to an embodiment of the present disclosure.

As illustrated in FIG. 6, an impedance-adjusting circuit 14A is a series circuit consisting of an inductor 141A, a resistance element 142A, and a capacitor 143A. The impedance-adjusting circuit 14A is connected between a connection point between the coupling line 11S and the coupling line 12S, and the ground potential.

Furthermore, in the above description, a directional coupler is described that performs coupling for two frequencies, but coupling may alternatively be performed for three or more frequencies. FIG. 7 is a circuit diagram illustrating another form of a directional coupler according to an embodiment of the present disclosure.

As illustrated in FIG. 7, a directional coupler 10B differs from the directional coupler 10 illustrated in FIG. 1 in that the directional coupler 10B further includes a coupling circuit 15, an impedance-adjusting circuit 16, an input/output terminal PioM, and an antenna terminal PaM. In addition, the impedance-adjusting circuit 14 is replaced with an impedance-adjusting circuit 14B.

The coupling circuit 15 includes a transmission line 15M and a coupling line 15S. The transmission line 15M and the coupling line 15S electromagnetically couple to each other. The coupling circuit 15 is configured to operate as a directional coupler at a third frequency. The third frequency is a frequency between the first frequency and the second frequency.

The transmission line 15M is connected between the input/output terminal PioM and the antenna terminal PaM. The antenna terminal PaM is connected to an external antenna ANTM.

The coupling line 15S is connected in series with and between the coupling line 11S and the coupling line 12S. Specifically, one end of the coupling line 15s is connected to the other end of the coupling line 11S, and the other end of the coupling line 15s is connected to the one end of the coupling line 12S. The coupling line 15S is connected to the coupling line 11S via an intermediate transmission line 191, and is connected to the coupling line 12S via an intermediate transmission line 192.

The impedance-adjusting circuit 16 is connected between the intermediate transmission line 191 and the ground potential. The impedance on the termination-resistor side of the coupling line 15S is matched by the impedance-adjusting circuit 16. The impedance-adjusting circuit 16 is implemented by appropriately connecting an inductor, a capacitor, and a resistance element to one another similarly to as in the impedance-adjusting circuit 14.

The impedance-adjusting circuit 14B is connected between the intermediate transmission line 192 and the ground potential. The impedance is matched on the termination-resistor side of the coupling line 12S by the impedance-adjusting circuit 14B. The impedance-adjusting circuit 14B is implemented by appropriately connecting an inductor, a capacitor, and a resistance element to one another similarly to as in the impedance-adjusting circuit 14.

Thus, in the form illustrated in FIG. 7, a directional coupler for three high-frequency signals having different frequencies from each other can be realized, and stable and high coupling performance can be realized for three high-frequency signals having different frequencies from each other.

A directional coupler can also be realized for four or more high frequencies using a similar concept.

In addition, in the above description, a coupling line for a high-frequency signal having a relatively high frequency is arranged closer to the termination-resistor side than a coupling line for a high-frequency signal having a relatively low frequency, but a different order may be adopted. However, impedance matching can be more easily performed on the termination-resistor side if the coupling line for a high-frequency signal having a relatively high frequency is arranged closer to the termination-resistor side than a coupling line for a high-frequency signal having a relatively low frequency.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A directional coupler comprising:
    a first transmission line along which a first high-frequency signal of a first frequency is transmitted;
    a second transmission line along which a second high-frequency signal of a second frequency is transmitted, the second frequency being different than the first frequency;
    a first coupling line that is electromagnetically coupled to the first transmission line;
    a second coupling line that is connected in series with the first coupling line and is electromagnetically coupled to the second transmission line;
    a termination resistor that is connected to a first end of the first coupling line, the first end of the first coupling line being opposite of a second end of the first coupling line, the second end of the first coupling line being connected to the second coupling line, and ground;
    a coupling signal output terminal that is connected to a first end of the second coupling line, the first end of the second coupling line being opposite of a second end of the second coupling line, the second end of the second coupling line being connected to the first coupling line;
    an intermediate transmission line between the second end of the first coupling line and the second end of the second coupling line; and
    an impedance-adjusting circuit configured to perform impedance matching for the first frequency and the second frequency with respect to a series line, the series line comprising the first coupling line and the second coupling line,
    wherein the impedance-adjusting circuit comprises an inductor, a capacitor, and a resistor, and
    wherein a first end of the impedance-adjusting circuit is connected to the intermediate transmission line and a second end of the impedance-adjusting circuit is connected to a ground potential.

2. The directional coupler according to claim 1, wherein the first frequency is greater than the second frequency.

3. The directional coupler according to claim 1, further comprising:
    a multilayer substrate in which a plurality of dielectric layers are stacked on top of one another and in which the first transmission line, the second transmission line, the first coupling line, and the second coupling line are formed,
    wherein the multilayer substrate includes a first dielectric layer on which the first transmission line and the second transmission line are formed, and a second dielectric layer on which the first coupling line and the second coupling line are formed,
    wherein the first transmission line and the second transmission line are arranged at different positions on the first dielectric layer,
    wherein the first coupling line is formed at a position on the second dielectric layer that overlaps the first transmission line when the first dielectric layer and the second dielectric layer are stacked on top of each other directly or with at least one dielectric layer therebetween, and
    wherein the second coupling line is formed at a position on the second dielectric layer that overlaps the second transmission line when the first dielectric layer and the second dielectric layer are stacked on top of each other directly or with at least one dielectric layer therebetween.

4. The directional coupler according to claim 3, wherein at least one element of the impedance-adjusting circuit is a surface mount electronic component that is mounted on a surface of a layer of the multilayer substrate.

5. The directional coupler according to claim 3, further comprising:
    a termination resistor that is connected between a first end of the first coupling line and ground,
    wherein the termination resistor, the first coupling line, and the second coupling line are connected in series,
    wherein the termination resistor is a surface mount electronic component that is mounted on a surface of a dielectric layer that forms a surface layer of the multilayer substrate, and
    wherein the first coupling line contacts a rear surface of a dielectric layer that forms a surface layer of the multilayer substrate and is connected to the termination resistor by only a via conductor formed in the multilayer substrate.

6. The directional coupler according to claim 3, further comprising:
    a ground via conductor that is connected to a ground terminal on a rear surface of a dielectric layer that forms a rear surface layer of the multilayer substrate and is disposed, in a plan view, between the first coupling line and the second coupling line and between the first transmission line and the second transmission line.

7. The directional coupler according to claim 1, further comprising:
    a third transmission line along which a third high-frequency signal of a third frequency is transmitted, the third frequency being different than the first frequency and the second frequency;
    a third coupling line that is connected in series with the first coupling line and the second coupling line, is connected between the first coupling line and the second coupling line, and is electromagnetically coupled to the third transmission line; and
    a second impedance-adjusting circuit, wherein the impedance-adjusting circuit and the second impedance-adjusting circuit are configured to perform impedance matching for the first frequency, the second frequency, and the third frequency with respect to the series line, the series line further comprising the third coupling line.

8. A high-frequency front-end module comprising:
the directional coupler according to claim 1;
a first filter that is connected to the first transmission line;
a second filter that is connected to the second transmission line; and
a high-frequency amplification circuit that is connected to at least one of the first filter and the second filter.

9. A communication device comprising:
the high-frequency front-end module according to claim 8;
a first antenna that is connected to the first transmission line;
a second antenna that is connected to the second transmission line;
a coupling signal output terminal of the directional coupler that is connected to a first end of the second coupling line, wherein the first coupling line, the second coupling line, and the coupling signal output terminal are connected in series; and
a control integrated circuit configured to control the high-frequency amplification circuit using a coupling signal output from the coupling signal output terminal.

10. A directional coupler comprising:
a first transmission line along which a first high-frequency signal of a first frequency is transmitted;
a second transmission line along which a second high-frequency signal of a second frequency is transmitted, the second frequency being different than the first frequency;
a first coupling line that is electromagnetically coupled to the first transmission line;
a second coupling line that is connected in series with the first coupling line and is electromagnetically coupled to the second transmission line;
a termination resistor that is connected between a first end of the first coupling line and ground;
a coupling signal output terminal that is connected to a first end of the second coupling line, wherein the termination resistor, the first coupling line, the second coupling line, and the coupling signal output terminal are connected in series;
an impedance-adjusting circuit, wherein a first end of the impedance-adjusting circuit is connected between a second end of the first coupling line and a second end of the second coupling line; and
an intermediate transmission line between the second end of the first coupling line and the second end of the second coupling line,
wherein the impedance-adjusting circuit comprises an inductor, a capacitor, and a resistor, and
wherein a first end of the impedance-adjusting circuit is connected to the intermediate transmission line and a second end of the impedance-adjusting circuit is connected to a ground potential.

11. The directional coupler according to claim 10, wherein the first frequency is greater than the second frequency.

12. The directional coupler according to claim 10, further comprising:
a multilayer substrate in which a plurality of dielectric layers are stacked on top of one another and on which the first transmission line, the second transmission line, the first coupling line, and the second coupling line are formed,
wherein the multilayer substrate includes a first dielectric layer on which the first transmission line and the second transmission line are formed, and a second dielectric layer on which the first coupling line and the second coupling line are formed,
wherein the first transmission line and the second transmission line are arranged at different positions on the first dielectric layer,
wherein the first coupling line is formed at a position on the second dielectric layer that overlaps the first transmission line when the first dielectric layer and the second dielectric layer are stacked on top of each other directly or with at least one dielectric layer therebetween, and
wherein the second coupling line is formed at a position on the second dielectric layer that overlaps the second transmission line when the first dielectric layer and the second dielectric layer are stacked on top of each other directly or with at least one dielectric layer therebetween.

13. The directional coupler according to claim 12, wherein at least one element of the impedance-adjusting circuit is a surface mount electronic component that is mounted on a surface of a layer of the multilayer substrate.

14. The directional coupler according to claim 12,
wherein the termination resistor is a surface mount electronic component that is mounted on a surface of a dielectric layer that forms a surface layer of the multilayer substrate, and
wherein the first coupling line contacts a rear surface of a dielectric layer that forms a surface layer of the multilayer substrate and is connected to the termination resistor by only a via conductor formed in the multilayer substrate.

15. The directional coupler according to claim 12, further comprising:
a ground via conductor that is connected to a ground terminal on a rear surface of a dielectric layer that forms a rear surface layer of the multilayer substrate and is disposed, in a plan view, between the first coupling line and the second coupling line and between the first transmission line and the second transmission line.

16. The directional coupler according to claim 10, further comprising:
a third transmission line along which a third high-frequency signal of a third frequency is transmitted, the third frequency being different than the first frequency and the second frequency;
a third coupling line that is connected in series with and between the first coupling line and the second coupling line, and is electromagnetically coupled to the third transmission line, wherein a first end of the third coupling line is connected to the second end of the first coupling line and a second end of the third coupling line is connected to the second end of the second coupling line; and
a second impedance-adjusting circuit, wherein the first end of the impedance-adjusting circuit is connected between the second end of the third coupling line and the second end of the second coupling line, and a first end of the second impedance-adjusting circuit is connected between the second end of the first coupling line and the first end of the third coupling line.

17. A high-frequency front-end module comprising:
the directional coupler according to claim 10;
a first filter that is connected to the first transmission line;

a second filter that is connected to the second transmission line; and a high-frequency amplification circuit that is connected to at least one of the first filter and the second filter.

18. A communication device comprising:

the high-frequency front-end module according to claim 17;

a first antenna that is connected to the first transmission line;

a second antenna that is connected to the second transmission line; and a control integrated circuit configured to control the high-frequency amplification circuit using a coupling signal output from the coupling signal output terminal.

* * * * *